(12) United States Patent
Ji et al.

(10) Patent No.: US 11,903,180 B2
(45) Date of Patent: Feb. 13, 2024

(54) METHOD OF MANUFACTURING SEMICONDUCTOR DEVICE HAVING WORD LINE STRUCTURE

(71) Applicant: NANYA TECHNOLOGY CORPORATION, New Taipei (TW)

(72) Inventors: Cheng-Yan Ji, New Taipei (TW); Wei-Tong Chen, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 134 days.

(21) Appl. No.: 17/700,406

(22) Filed: Mar. 21, 2022

(65) Prior Publication Data
US 2023/0301055 A1    Sep. 21, 2023

(51) Int. Cl.
*H10B 12/00* (2023.01)

(52) U.S. Cl.
CPC .......... *H10B 12/053* (2023.02); *H10B 12/34* (2023.02)

(58) Field of Classification Search
None
See application file for complete search history.

(56) References Cited

U.S. PATENT DOCUMENTS

| | | | |
|---|---|---|---|
| 11,769,779 B2 * | 9/2023 | Sun | .............. H01L 21/02129 |
| | | | 257/292 |
| 2014/0159145 A1 | 6/2014 | Park et al. | |
| 2020/0066726 A1 * | 2/2020 | Fishburn | ............ H01L 29/4236 |
| 2020/0286897 A1 | 9/2020 | Panda et al. | |
| 2020/0395455 A1 | 12/2020 | Kim | |

FOREIGN PATENT DOCUMENTS

| | | |
|---|---|---|
| CN | 110190054 A | 8/2019 |
| CN | 111564441 A | 8/2020 |
| CN | 114068685 A | 2/2022 |
| TW | 202131489 A | 8/2021 |

OTHER PUBLICATIONS

Taiwanese Office Action dated May 9, 2023 in application No. 111119544, the search report attached to the Office Action; pp. 1-6.

* cited by examiner

*Primary Examiner* — Hsien Ming Lee
(74) *Attorney, Agent, or Firm* — Muncy, Geissler, Olds & Lowe, P.C.

(57) ABSTRACT

A method of manufacturing a semiconductor device is provided. The method includes providing a semiconductor substrate having a trench. The method also includes forming a first buffer layer in the trench. The method further includes forming a doped-polysilicon layer on the first buffer layer in the trench. The method also includes performing a thermal treatment on the doped-polysilicon layer.

8 Claims, 17 Drawing Sheets

METHOD OF MANUFACTURING SEMICONDUCTOR DEVICE HAVING WORD LINE STRUCTURE

TECHNICAL FIELD

The present disclosure relates to a method of manufacturing a semiconductor device, and more particularly, to a method of manufacturing a semiconductor device having a word line structure.

DISCUSSION OF THE BACKGROUND

With the rapid growth of electronic industry, the development of semiconductor devices has achieved high performance and miniaturization. As the size of semiconductor devices, such as dynamic random access memory (DRAM) devices, shrinks, the gate channel length decreases correspondingly. Consequently, a short channel effect may occur. To deal with such problem, a buried-channel array transistor (BCAT) device has been proposed.

However, although the recessed channel of the BCAT device has improved the short channel effect, the BCAT device suffers from other issues and thus adversely affects the performance and the stability of the semiconductor device.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor device. The semiconductor device includes a semiconductor substrate and a word line structure. The semiconductor substrate has an active region. The word line structure is disposed in the active region of the semiconductor substrate. The word line structure includes a first work function layer, a second work function layer, and a buffer structure. The second work function layer is on the first work function layer. The buffer structure is between the first work function layer and the second work function layer.

Another aspect of the present disclosure provides a semiconductor device. The semiconductor device includes a semiconductor substrate and a word line structure. The semiconductor substrate has a trench. The word line structure is disposed in the trench of the semiconductor substrate. The word line structure includes a doped-polysilicon layer and a buffer structure. The buffer structure directly contacts a bottom surface of the doped-polysilicon layer.

Another aspect of the present disclosure provides a method of manufacturing a semiconductor device. The method includes providing a semiconductor substrate having a trench. The method also includes forming a first buffer layer in the trench. The method further includes forming a doped-polysilicon layer on the first buffer layer in the trench. The method also includes performing a thermal treatment on the doped-polysilicon layer.

In the semiconductor device, with the design of the buffer structure, interfaces between the work function layer and its adjacent layers or films are less diverse, and thus the extents of recrystallization of grains in the word function layer at the interfaces between the work function layer and its adjacent layers or films can be relatively uniform, resulting in relatively uniform forces applied on the interfaces during the thermal treatment. Therefore, generation of voids may be mitigated or prevented by a relatively simplified process, and the electrical performance of the semiconductor device can be free from being adversely affected.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
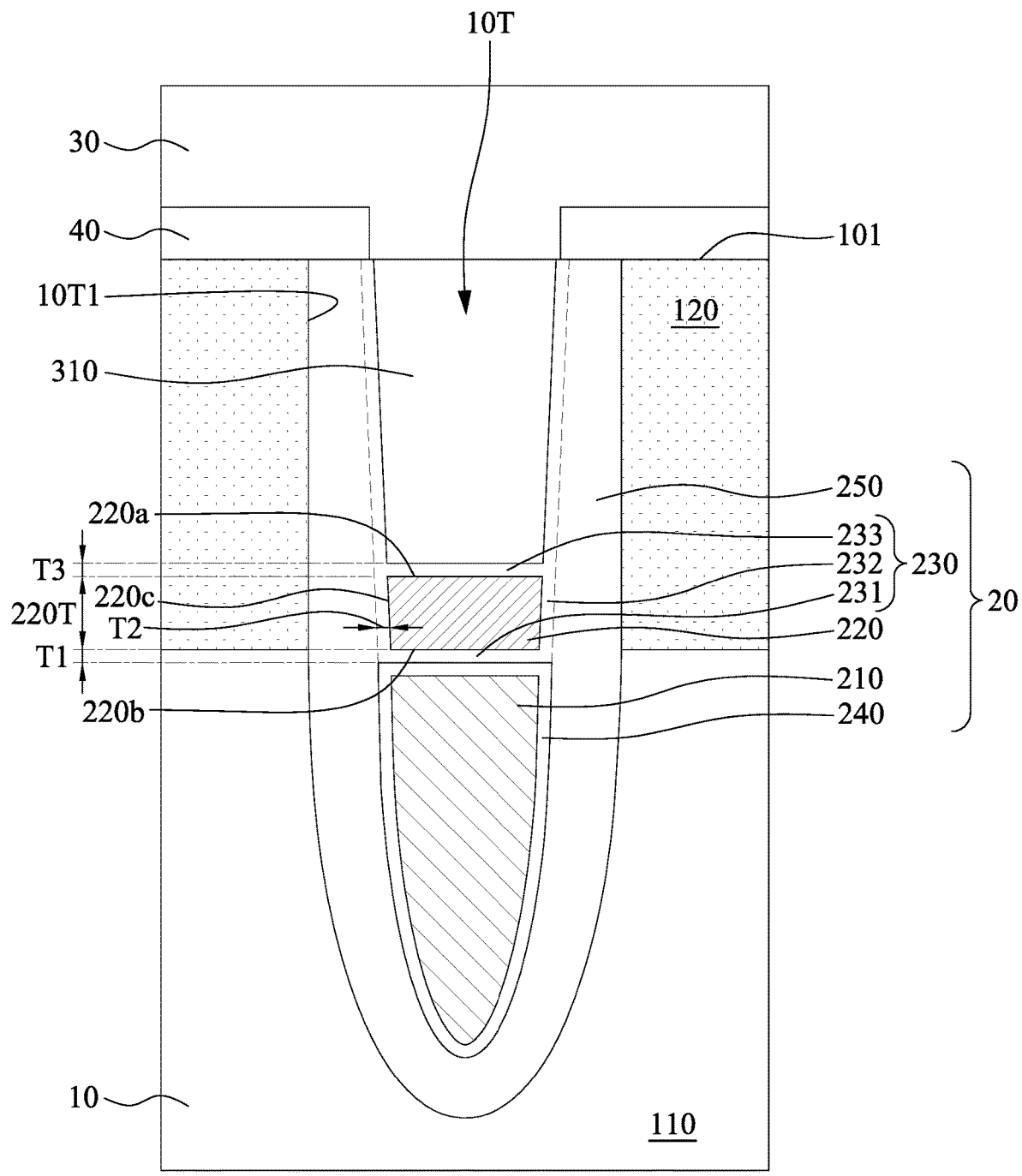
FIG. 1 is a schematic view of a semiconductor device, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a schematic view of a semiconductor device 1, in accordance with some embodiments of the present disclosure. The semiconductor device 1 includes a semiconductor substrate 10, a word line structure 20, a dielectric structure 30, and an overlying layer 40.

The semiconductor substrate 10 may be formed of, for example, silicon, doped silicon, silicon germanium, silicon on insulator, silicon on sapphire, silicon germanium on insulator, silicon carbide, germanium, gallium arsenide, gallium phosphide, gallium arsenide phosphide, indium phosphide, indium gallium phosphide, or any other IV-IV, III-V or I-VI semiconductor material.

In some embodiments, the semiconductor substrate 10 may have one or more active regions 110 defined by one or more isolation structures (not shown in drawings). In some embodiments, the semiconductor substrate 10 may include one or more doped regions 120 formed in the active region 110. The doped regions 120 may be formed by an implantation process using dopant such as phosphorus, arsenic, or antimony. The doped regions 120 may respectively have a dopant concentration ranging from about $10^{17}$ atoms/cm$^3$ to about $10^{19}$ atoms/cm$^3$. The doped regions 120 may serve as source/drain regions. In some embodiments, the semiconductor substrate 10 has a trench 10T. In some embodiments, the trench 10T penetrates the semiconductor substrate 10 and exposed from a top surface 101 of the semiconductor substrate 10.

In some embodiments, the word line structure 20 is disposed in the active region 110 of the semiconductor substrate 10. In some embodiments, the word line structure 20 is disposed in the trench 10T of the semiconductor substrate 10. In some embodiments, the word line structure 20 includes work function layers 210 and 220, a buffer structure 230, a barrier layer 240, and a dielectric layer 250.

In some embodiments, the work function layer 210 may be or include a conductive layer. In some embodiments, the work function layer 210 includes metal, e.g., tungsten (W). In some embodiments, the work function layer 210 may have a work-function value of equal to or greater than about 4.2 eV. The work function layer 210 can keep a relatively high sub-threshold voltage so as to reduce channel leak.

In some embodiments, the work function layer 220 is disposed over the work function layer 210. In some embodiments, the work function layer 220 includes polysilicon, e.g., doped polysilicon. The dopant may be or include phosphorus, arsenic, or antimony. For example, the work function layer 220 may be a phosphorous-doped polysilicon layer. In some embodiments, the work function layer 220 may be or include a doped-polysilicon layer. In some embodiments, the work function layer 220 may have a work-function value of about 4.2 eV. The work function layer 220 having a relatively low work function value can reduce the gate-induced drain leakage (GIDL) current of the semiconductor device 1. In some embodiments, the work function layer 220 has a thickness 220T from about 20 nm to about 25 nm.

In some embodiments, the buffer structure 230 is between the work function layer 210 and the work function layer 220. In some embodiments, the buffer structure 230 is between the work function layer 210 and a bottom surface 220b of the work function layer 220. In some embodiments, the buffer structure 230 directly contacts the work function layer 220. In some embodiments, the buffer structure 230 may surround a plurality of surfaces (e.g., surfaces 220a, 220b and 220c) of the work function layer 220. In some embodiments, the buffer structure 230 directly contacts a plurality of surfaces (e.g., the surfaces 220a, 220b and 220c) of the work function layer 220. In some embodiments, the buffer structure 230 entirely covers and contacts the surfaces (e.g., the surfaces 220a, 220b and 220c) of the work function layer 220. In some embodiments, the buffer structure 230 directly contacts the bottom surface 220b of the work function layer 220. In some embodiments, the buffer structure 230 directly contacts a top surface 220a, the bottom surface 220b, and lateral surfaces 220c of the work function layer 220.

In some embodiments, the buffer structure 230 has a thickness T1 from about 1 nm to about 2 nm. In some embodiments, the thickness T1 of the buffer structure 230 is from about 1.2 nm to about 1.8 nm, from about 1.3 nm to about 1.7 nm, or from about 1.5 nm to about 1.6 nm. In some embodiments, the buffer structure 230 includes an oxide material. In some embodiments, the buffer structure 230 may be or include silicon oxide. According to some embodiments of the present disclosure, the thickness of the buffer structure 230 satisfies the above condition, and thus the thickness of the buffer structure 230 is not too thick to occupy too much space of the trench 10T. Therefore, the trench 10T can provide sufficient space for the work function layer 220.

In some embodiments, the buffer structure 230 includes a plurality of buffer layers or portions (e.g., layers 231, 232, and 233). In some embodiments, the buffer layer 231 is between the work function layer 210 and the work function layer 220. In some embodiments, the buffer layer 231 directly contacts the bottom surface 220b of the work function layer 220. In some embodiments, the buffer layer 233 is on the work function layer 220. In some embodiments, the buffer layer 233 directly contacts the top surface 220a of the work function layer 220. In some embodiments, the buffer layers 232 are between the work function layer 220 and an inner sidewall 10T1 of the trench 10T. In some embodiments, the buffer layers 232 directly contact the lateral surfaces 220c of the work function layer 220. In some embodiments, the buffer layers 232 extend along the inner sidewall 10T1 of the trench 10T.

In some embodiments, the buffer layer 231 has a thickness T1 from about 1 nm to about 2 nm. In some embodiments, the thickness T1 of the buffer layer 231 is from about 1.2 nm to about 1.8 nm, from about 1.3 nm to about 1.7 nm, or from about 1.5 nm to about 1.6 nm. In some embodiments, the buffer layer 232 has a thickness T2 from about 1 nm to about 2 nm. In some embodiments, the thickness T2 of the buffer layer 232 is from about 1.2 nm to about 1.8 nm, from about 1.3 nm to about 1.7 nm, or from about 1.5 nm to about 1.6 nm. In some embodiments, the buffer layer 233 has a thickness T3 from about 1 nm to about 2 nm. In some embodiments, the thickness T3 of the buffer layer 233 is from about 1.2 nm to about 1.8 nm, from about 1.3 nm to about 1.7 nm, or from about 1.5 nm to about 1.6 nm.

In some embodiments, the barrier layer 240 is between the buffer structure 230 and the work function layer 210. In some embodiments, the barrier layer 240 directly contacts the buffer structure 230 and the work function layer 210. In some embodiments, the buffer structure 230 is between the work function layer 220 and the barrier layer 240. In some embodiments, the barrier layer 240 is between the work function layer 210 and the inner sidewall 10T1 of the trench 10T. In some embodiments, the barrier layer 240 surrounds the work function layer 210. In some embodiments, the barrier layer 240 may be a single-layered structure or a multi-layered structure including refractory metals (such as tantalum and titanium), refractory metal nitrides, or refractory metal silicon nitrides. In some embodiments, the barrier layer 240 may be or include a titanium nitride layer.

In some embodiments, the dielectric layer 250 surrounds the work function layer 210 and the work function layer 220. In some embodiments, the dielectric layer 250 is on the inner sidewall 10T1 of the trench 10T. In some embodiments, the dielectric layer 250 directly contacts the buffer structure 230. In some embodiments, the dielectric layer 250 is spaced apart from the work function layer 220 by the buffer structure 230. In some embodiments, the dielectric layer 250 includes an oxide material. In some embodiments, the dielectric layer 250 may be or include silicon oxide. In some embodiments, the dielectric layer 250 has a thickness from about 4 nm to about 8 nm. In some embodiments, the dielectric layer 250 has a thickness of about 6 nm. In some embodiments, the dielectric layer 250 functions as a gate oxide.

In some embodiments, the buffer structure 230 and the dielectric layer 250 may be or include different materials. In some embodiments, the buffer layer 232 of the buffer structure 230 is formed on the dielectric layer 250 and extends along the inner sidewall 10T1 of the trench 10T of the semiconductor substrate 10. In some embodiments, the buffer structure 230 and the dielectric layer 250 may be or include the same material. In some embodiments, the interface between the dielectric layer 250 and the buffer layer 232 of the buffer structure 230 is not observed.

In some embodiments, the dielectric structure 30 is in the trench 10T and over the work function layer 220. In some embodiments, the dielectric structure 30 includes a portion 310 directly contacting the buffer layer 233 of the buffer structure 230. In some embodiments, the dielectric structure 30 may be or include a nitride layer, e.g., silicon nitride.

In some embodiments, the overlying layer 40 is disposed over the top surface 101 of the semiconductor substrate 10. In some embodiments, the overlying layer 40 has an opening exposing the trench 10T of the semiconductor substrate 10. In some embodiments, the overlying layer 40 may function as a hard mask for patterning the semiconductor substrate 10 to form the trench 10T. In some embodiments, the overlying layer 40 may be used as an anti-reflective coating (ARC) layer to minimize the optical reflection of the radiation used to expose a photoresist layer coated on the overlying layer 40. In some embodiments, the overlying layer 40 includes an inorganic material, including nitride. In some embodiments, the overlying layer 40 may be or include a silicon nitride layer.

In some cases where a doped-polysilicon layer contacts an oxide layer by its bottom surface and contacts a TiN layer by its lateral surface, after a high-temperature process is performed on the doped-polysilicon layer, voids may be formed at the interface between the doped-polysilicon layer and the TiN layer. The grains in the doped-polysilicon layer may recrystallize under the high-temperature process, and the extents of recrystallization are different at different interfaces (i.e., the interface between the doped-polysilicon layer and the oxide layer and the interface between the doped-polysilicon layer and the TiN layer), resulting in different forces applied on the interfaces during the high-temperature process. Thus, voids may be formed, and this can undesirably affect the electrical performance of the semiconductor device.

In order to solve the above problems, several approaches have been proposed. For example, the condition of the high-temperature process may be adjusted to reduce the generation of voids. However, the properties of doped regions are highly dependent on the condition of the high-temperature process, and thus the electrical properties of the semiconductor device may be affected. For example, the dopant concentration, the deposition rate, and/or the deposition pressure of the doped-polysilicon layer may be adjusted to form grains that have a relatively small size so as to reduce the forces that facilitate the generation of voids. However, the properties of the doped-polysilicon layer is highly dependent on the deposition condition as well as the dopant concentration, and thus the electrical properties of the doped-polysilicon layer and the semiconductor device may be affected.

According to some embodiments of the present disclosure, with the design of the buffer structure 230, interfaces between the work function layer 220 and its adjacent layers or films are less diverse, and thus the extents of recrystallization of grains in the word function layer 220 at the interfaces between the work function layer 220 and its adjacent layers or films can be relatively uniform, resulting in relatively uniform forces applied on the interfaces during the thermal treatment P1. Therefore, generation of voids may be mitigated or prevented by a relatively simplified process, and the electrical performance of the semiconductor device 1 can be free from being adversely affected.

In addition, according to some embodiments of the present disclosure, the work function layer 220 is a doped-polysilicon layer, and the buffer structure 230 surrounds or contacts a plurality of surfaces of the doped-polysilicon layer. Therefore, the work function layer 220 (or the doped-polysilicon layer) has relatively uniform interfaces with its adjacent layers or films (e.g., interfaces with the buffer structure 230), the concentration of diffused dopants at the interfaces is relatively uniform, thereby resulting in relatively uniform forces applied on the interfaces during the thermal treatment P1. Therefore, generation of voids may be mitigated or prevented by a relatively simplified process, and the electrical performance of the semiconductor device 1 can be free from being adversely affected.

Moreover, according to some embodiments of the present disclosure, the buffer structure 230 and the dielectric layer 250 are formed of the same material, and thus the work function layer 220 (or the doped-polysilicon layer) has relatively uniform interfaces with its adjacent layers or films (e.g., interfaces with the buffer structure 230 and with the dielectric layer 250). Therefore, the concentration of diffused dopants at the interfaces is relatively uniform, thereby resulting in relatively uniform forces applied on the interfaces during the thermal treatment P1. Therefore, generation of voids may be mitigated or prevented by a relatively simplified process, and the electrical performance of the semiconductor device 1 can be free from being adversely affected.

Furthermore, according to some embodiments of the present disclosure, the buffer structure 230 entirely covers and contacts the surfaces of the work function layer 220, and thus the work function layer 220 (or the doped-polysilicon layer) has uniform interfaces with its adjacent layers or films (e.g., interfaces with the buffer structure 230). Therefore, the concentration of diffused dopants at the interfaces is uniform, thereby resulting in uniform forces applied on the interfaces during the thermal treatment P1. Therefore, generation of voids may be prevented by a relatively simplified process, and the electrical performance of the semiconductor device 1 can be free from being adversely affected.

Figure 2:
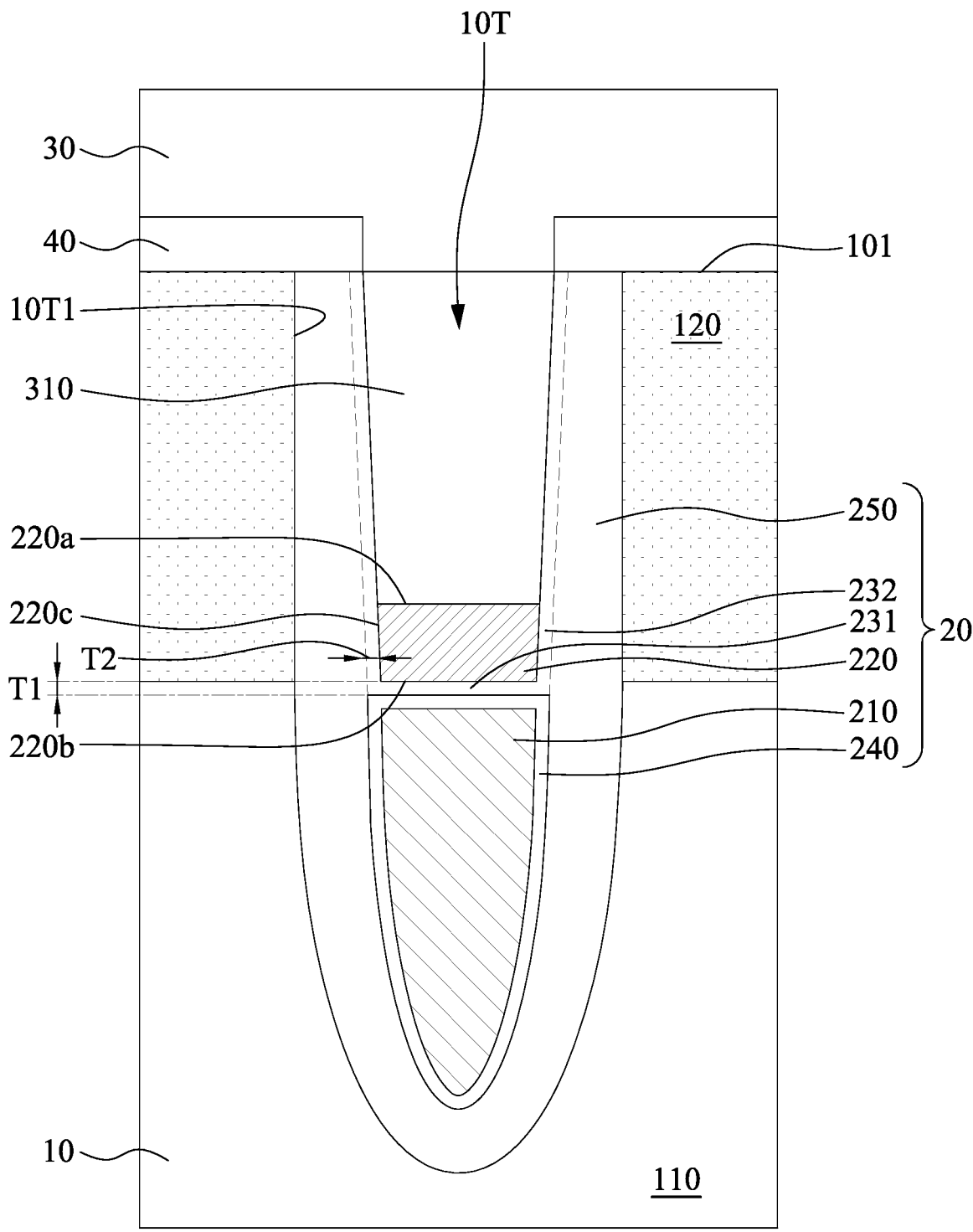
FIG. 2 is a schematic view of a semiconductor device, in accordance with some embodiments of the present disclosure.

FIG. 2 is a schematic view of a semiconductor device 2, in accordance with some embodiments of the present disclosure. The semiconductor device 2 includes a semiconductor substrate 10, a word line structure 20, a dielectric structure 30, and an overlying layer 40.

The semiconductor substrate 10 may be formed of, for example, silicon, doped silicon, silicon germanium, silicon on insulator, silicon on sapphire, silicon germanium on insulator, silicon carbide, germanium, gallium arsenide, gallium phosphide, gallium arsenide phosphide, indium phosphide, indium gallium phosphide, or any other IV-IV, III-V or I-VI semiconductor material.

In some embodiments, the semiconductor substrate 10 may have one or more active regions 110 defined by one or more isolation structures (not shown in drawings). In some embodiments, the semiconductor substrate 10 may include one or more doped regions 120 formed in the active region 110. The doped regions 120 may be formed by an implantation process using dopant such as phosphorus, arsenic, or antimony. The doped regions 120 may respectively have a dopant concentration ranging from about $10^{17}$ atoms/cm$^3$ to about $10^{19}$ atoms/cm$^3$. The doped regions 120 may serve as source/drain regions. In some embodiments, the semiconductor substrate 10 has a trench 10T. In some embodiments, the trench 10T penetrates the semiconductor substrate 10 and exposed from a top surface 101 of the semiconductor substrate 10.

In some embodiments, the word line structure 20 is disposed in the active region 110 of the semiconductor substrate 10. In some embodiments, the word line structure 20 is disposed in the trench 10T of the semiconductor substrate 10. In some embodiments, the word line structure 20 includes work function layers 210 and 220, a buffer structure 230, a barrier layer 240, and a dielectric layer 250.

In some embodiments, the work function layer 210 may be or include a conductive layer. In some embodiments, the work function layer 210 includes metal, e.g., tungsten (W). In some embodiments, the work function layer 210 may have a work-function value of equal to or greater than about 4.2 eV. The work function layer 210 can keep a relatively high sub-threshold voltage so as to reduce channel leak.

In some embodiments, the work function layer 220 is disposed over the work function layer 210. In some embodiments, the work function layer 220 includes polysilicon, e.g., doped polysilicon. The dopant may be or include phosphorus, arsenic, or antimony. For example, the work function layer 220 may be a phosphorous-doped polysilicon layer. In some embodiments, the work function layer 220 may be or include a doped-polysilicon layer. In some embodiments, the work function layer 220 may have a work-function value of about 4.2 eV. The work function layer 220 having a relatively low work function value can reduce the gate-induced drain leakage (GIDL) current of the semiconductor device 1.

In some embodiments, the buffer structure 230 is between the work function layer 210 and the work function layer 220. In some embodiments, the buffer structure 230 is between the work function layer 210 and a bottom surface 220b of the work function layer 220. In some embodiments, the buffer structure 230 directly contacts the work function layer 220. In some embodiments, the buffer structure 230 may surround a plurality of surfaces (e.g., surfaces 220b and 220c) of the work function layer 220. In some embodiments, the buffer structure 230 directly contacts a plurality of surfaces (e.g., the surfaces 220b and 220c) of the work function layer 220. In some embodiments, the buffer structure 230 directly contacts the bottom surface 220b of the work function layer 220. In some embodiments, the buffer structure 230 directly contacts the bottom surface 220b and lateral surfaces 220c of the work function layer 220.

In some embodiments, the buffer structure 230 has a thickness T1 from about 1 nm to about 2 nm. In some embodiments, the thickness T1 of the buffer structure 230 is from about 1.2 nm to about 1.8 nm, from about 1.3 nm to about 1.7 nm, or from about 1.5 nm to about 1.6 nm. In some embodiments, the buffer structure 230 includes an oxide material. In some embodiments, the buffer structure 230 may be or include silicon oxide.

In some embodiments, the buffer structure 230 includes a plurality of buffer layers or portions (e.g., layers 231 and 232). In some embodiments, the buffer layer 231 is between the work function layer 210 and the work function layer 220. In some embodiments, the buffer layer 231 directly contacts the bottom surface 220b of the work function layer 220. In some embodiments, the buffer layers 232 are between the work function layer 220 and an inner sidewall 10T1 of the trench 10T. In some embodiments, the buffer layers 232 directly contact the lateral surfaces 220c of the work function layer 220. In some embodiments, the buffer layers 232 extend along the inner sidewall 10T1 of the trench 10T.

In some embodiments, the buffer layer 231 has a thickness T1 from about 1 nm to about 2 nm. In some embodiments, the thickness T1 of the buffer layer 231 is from about 1.2 nm to about 1.8 nm, from about 1.3 nm to about 1.7 nm, or from about 1.5 nm to about 1.6 nm. In some embodiments, the buffer layer 232 has a thickness T2 from about 1 nm to about 2 nm. In some embodiments, the thickness T2 of the buffer layer 232 is from about 1.2 nm to about 1.8 nm, from about 1.3 nm to about 1.7 nm, or from about 1.5 nm to about 1.6 nm.

In some embodiments, the barrier layer 240 is between the buffer structure 230 and the work function layer 210. In some embodiments, the barrier layer 240 directly contacts the buffer structure 230 and the work function layer 210. In some embodiments, the buffer structure 230 is between the work function layer 220 and the barrier layer 240. In some embodiments, the barrier layer 240 is between the work function layer 210 and the inner sidewall 10T1 of the trench 10T. In some embodiments, the barrier layer 240 surrounds the work function layer 210. In some embodiments, the barrier layer 240 may be a single-layered structure or a multi-layered structure including refractory metals (such as tantalum and titanium), refractory metal nitrides, or refractory metal silicon nitrides. In some embodiments, the barrier layer 240 may be or include a titanium nitride layer.

In some embodiments, the dielectric layer 250 surrounds the work function layer 210 and the work function layer 220. In some embodiments, the dielectric layer 250 is on the inner sidewall 10T1 of the trench 10T. In some embodiments, the dielectric layer 250 directly contacts the work function layer 220. In some embodiments, the dielectric layer 250 directly contacts the top surface 220a of the work function layer 220. In some embodiments, the dielectric layer 250 includes an oxide material. In some embodiments, the dielectric layer 250 may be or include silicon oxide. In some embodiments, the dielectric layer 250 has a thickness from about 4 nm to about 8 nm. In some embodiments, the dielectric layer 250 has a thickness of about 6 nm.

In some embodiments, the buffer structure 230 and the dielectric layer 250 may be or include different materials. In some embodiments, the buffer layer 232 of the buffer structure 230 is formed on the dielectric layer 250 and extends along the inner sidewall 10T1 of the trench 10T of the semiconductor substrate 10. In some embodiments, the buffer structure 230 and the dielectric layer 250 may be or include the same material. In some embodiments, the interface between the dielectric layer 250 and the buffer layer 232 of the buffer structure 230 is not observed.

In some embodiments, the dielectric structure 30 is in the trench 10T and over the work function layer 220. In some embodiments, the dielectric structure 30 includes a portion 310 directly contacting the buffer layer 233 of the buffer structure 230. In some embodiments, the dielectric structure 30 may be or include a nitride layer, e.g., silicon nitride.

In some embodiments, the overlying layer 40 is disposed over the top surface 101 of the semiconductor substrate 10. In some embodiments, the overlying layer 40 has an opening exposing the trench 10T of the semiconductor substrate 10. In some embodiments, the overlying layer 40 may function as a hard mask for patterning the semiconductor substrate 10 to form the trench 10T. In some embodiments, the overlying layer 40 may be used as an anti-reflective coating (ARC) layer to minimize the optical reflection of the radiation used to expose a photoresist layer coated on the overlying layer 40. In some embodiments, the overlying layer 40 includes an inorganic material, including nitride. In some embodiments, the overlying layer 40 may be or include a silicon nitride layer.

FIG. 3A, FIG. 3B, FIG. 3C, FIG. 3D, FIG. 3E, FIG. 3F, and FIG. 3G illustrate various stages of a method of manufacturing a semiconductor device 1, in accordance with some embodiments of the present disclosure.

Figure 3A:
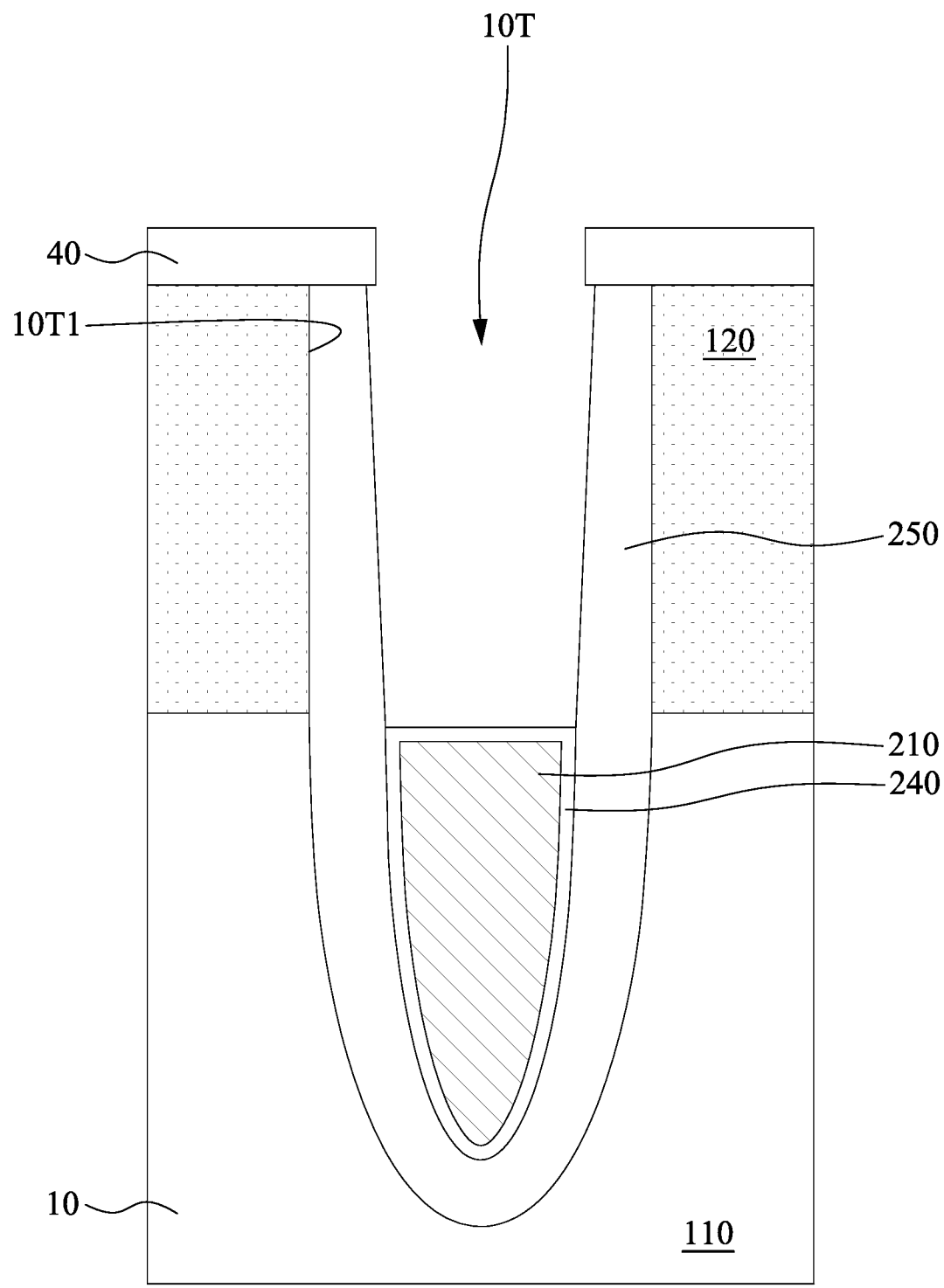
FIG. 3A illustrates one stage of a method of manufacturing a semiconductor device, in accordance with some embodiments of the present disclosure.

Referring to FIG. 3A, a semiconductor substrate 10 having a trench 10T may be provided, a dielectric layer 250 may be formed in the trench 10T, a work function layer 210 may be formed on the dielectric layer 250, and a barrier layer 240 may be formed on the work function layer 210.

In some embodiments, the semiconductor substrate 10 may be formed of, for example, silicon, doped silicon, silicon germanium, silicon on insulator, silicon on sapphire, silicon germanium on insulator, silicon carbide, germanium, gallium arsenide, gallium phosphide, gallium arsenide phosphide, indium phosphide, indium gallium phosphide, or any other IV-IV, III-V or I-VI semiconductor material. One or more isolation structures may be formed in the semiconductor substrate 10, and one or more active regions 110 of the semiconductor substrate 10 may be defined by the isolation structures.

Still referring to FIG. 3A, in some embodiments, one or more doped regions 120 may be formed in the active regions 110. The doped regions 120 may be formed by an implantation process using dopant such as phosphorus, arsenic, or antimony. The doped regions 120 may respectively have a dopant concentration ranging from about $10^{17}$ atoms/cm$^3$ to about $10^{19}$ atoms/cm$^3$. The doped regions 120 may serve as source/drain regions.

Still referring to FIG. 3A, in some embodiments, the trench 10T may be formed in the active region 110 of the semiconductor substrate 10. In some embodiments, the trench 10T may be formed by performing an etching process on the semiconductor substrate 10. In some embodiments, an overlying layer 40 may be disposed over the semiconductor substrate 10 and serve as a patterned hardmask for forming the trench 10T. The etching process may include a selective wet etching process or a selective dry etching process. A wet etching solution may include a tetramethylammonium hydroxide (TMAH) solution, a HF/HNO$_3$/CH$_3$COOH solution, or other suitable solution. The dry and wet etching processes have etching parameters that can be tuned, such as etchants used, etching temperature, etching solution concentration, etching pressure, source power, radio frequency (RF) bias voltage, RF bias power, etchant flow rate, and other suitable parameters. In some other embodiments, a wet etching solution may include NH$_4$OH, KOH (potassium hydroxide), HF (hydrofluoric acid), TMAH (tetramethylammonium hydroxide), other suitable wet etching solutions, or combinations thereof. In yet some other embodiments, a dry etching process may include a biased plasma etching process that uses a chlorine-based chemistry. Other dry etchant gasses include CF$_4$, NF$_3$, SF$_6$, and He. Dry etching may also be performed anisotropically using such mechanisms as DRIE (deep reactive-ion etching).

Still referring to FIG. 3A, in some embodiments, the dielectric layer 250 may be grown on the inner sidewall 10T1 of the trench 10T of the semiconductor substrate 10 using a thermal oxidation process. In some other embodiments, the dielectric layer 250 may be formed by chemical vapor deposition (CVD), atomic layer deposition (ALD), or any suitable method.

Still referring to FIG. 3A, in some embodiments, a bottom barrier material may be formed on the dielectric layer 250 in the trench 10T, the work function layer 210 may be formed on the bottom barrier material, and a top barrier material may be formed on the top surface of the work function layer 210. In some embodiments, the bottom barrier material and the top barrier material collectively form the barrier layer 240. In some embodiments, the bottom barrier material, the top barrier material, and the work function layer 210 may be formed by CVD, ALD, or any suitable method.

Figure 3B:
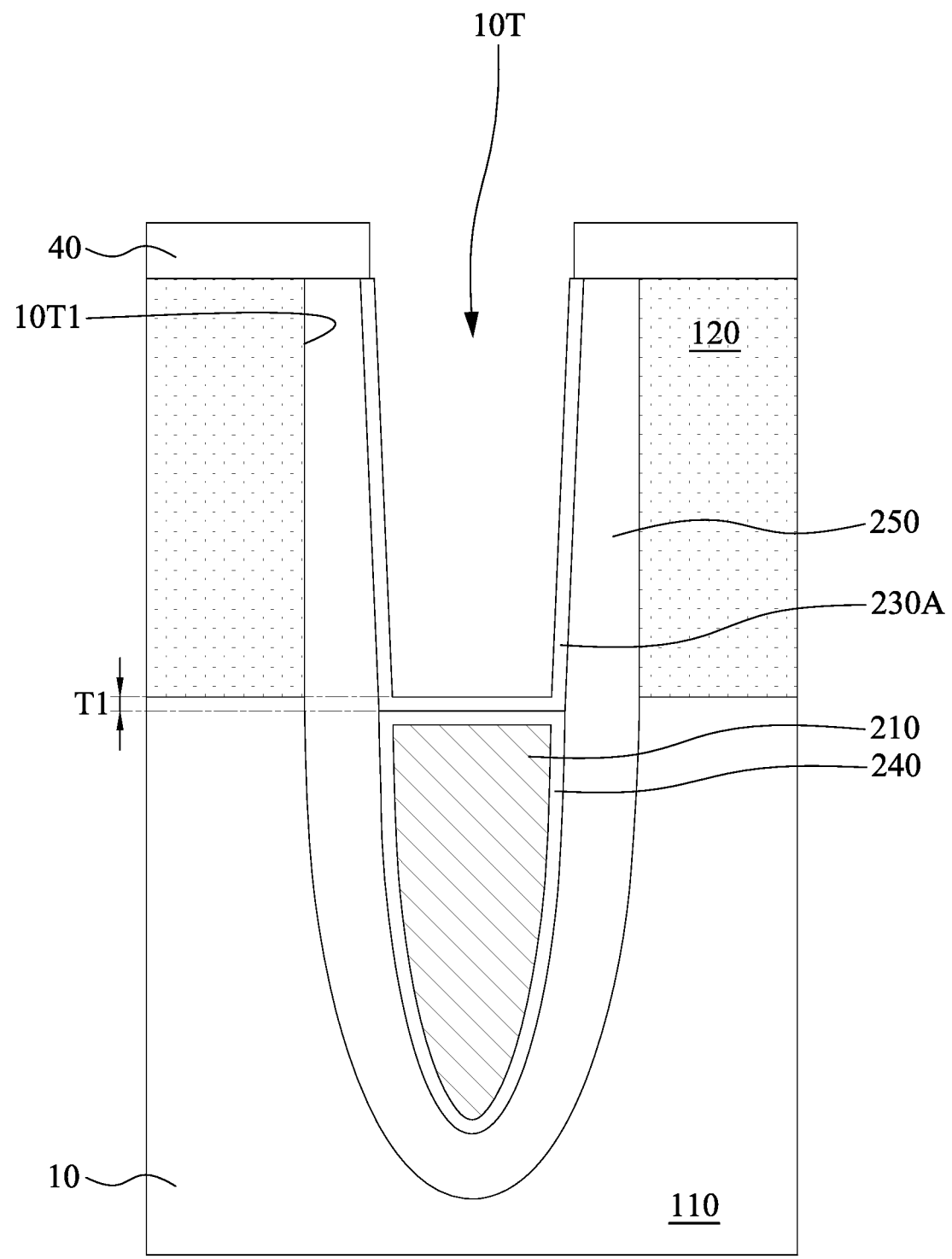
FIG. 3B illustrates one stage of a method of manufacturing a semiconductor device, in accordance with some embodiments of the present disclosure.

Referring to FIG. 3B, a buffer layer 230A may be formed in the trench 10T of the semiconductor substrate 10. In some embodiments, the buffer layer 230A is formed on the barrier layer 240 in the trench 10T of the semiconductor substrate 10. In some embodiments, the buffer layer 230A directly contacts the barrier layer 240. In some embodiments, the buffer layer 230A is formed on the inner sidewall 10T1 of the trench 10T of the semiconductor substrate 10. In some embodiments, the buffer layer 230A is formed on the dielectric layer 250 in the trench 10T of the semiconductor substrate 10. In some embodiments, the buffer layer 230A includes an oxide material. In some embodiments, the buffer layer 230A may be or include silicon oxide. In some embodiments, the buffer layer 230A and the dielectric layer 250 may be formed of or include the same material. In some embodiments, the buffer layer 230A may have a thickness T1 from about 1 nm to about 2 nm, from about 1.2 nm to about 1.8 nm, from about 1.3 nm to about 1.7 nm, or from about 1.5 nm to about 1.6 nm. In some embodiments, the buffer layer 230A is formed by an atomic layer deposition (ALD) process.

Figure 3C:
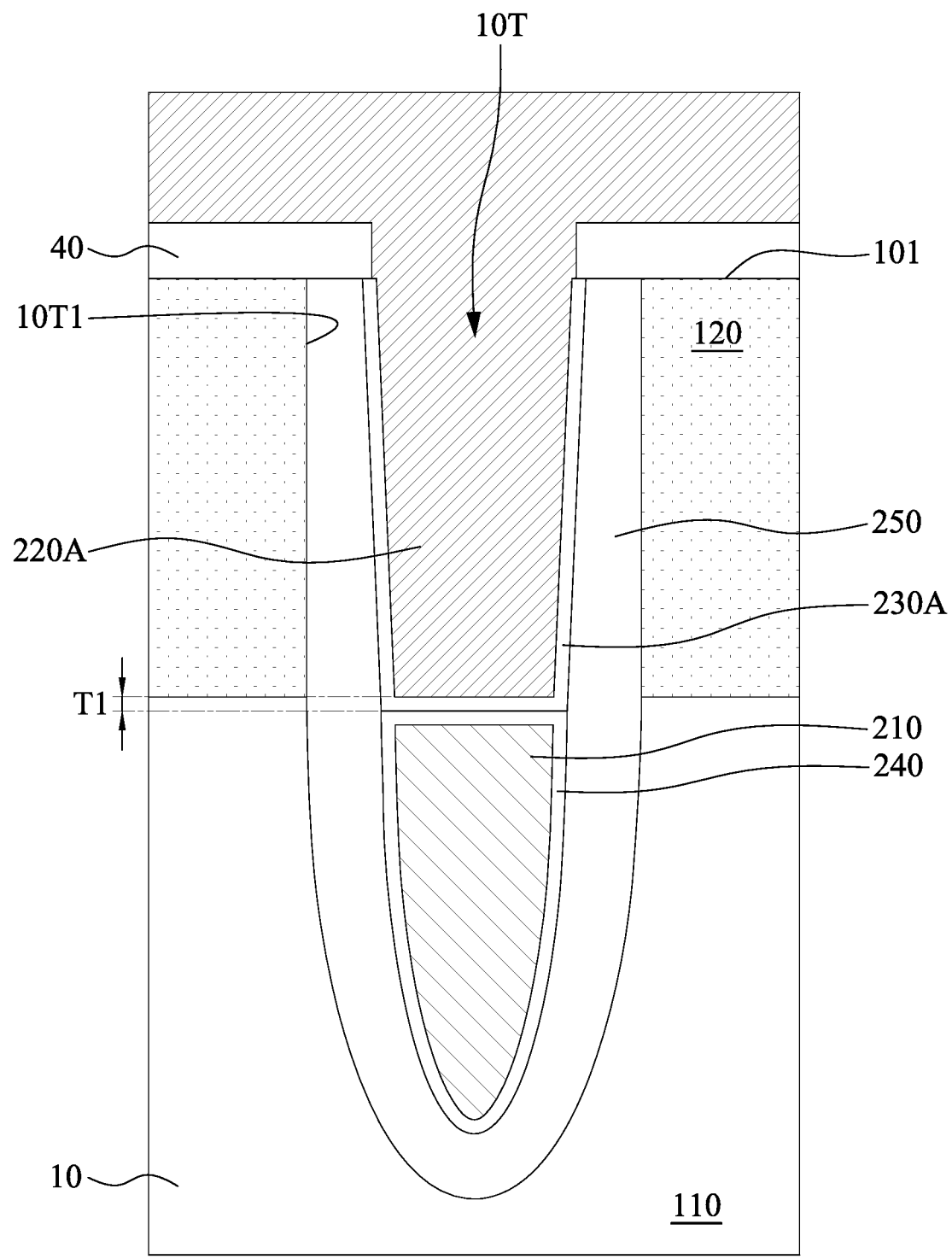
FIG. 3C illustrates one stage of a method of manufacturing a semiconductor device, in accordance with some embodiments of the present disclosure.

Referring to FIG. 3C, a work function layer 220A may be formed on the buffer layer 230A in the trench 10T of the semiconductor substrate 10. In some embodiments, the work function layer 220A directly contacts the buffer layer 230A. In some embodiments, the work function layer 220A is further formed over the top surface 101 of the semiconductor substrate 10. In some embodiments, the work function layer 220A includes polysilicon, e.g., doped polysilicon. The dopant may be or include phosphorus, arsenic, or antimony. For example, the work function layer 220A may be a phosphorous-doped polysilicon layer. In some embodiments, the work function layer 220A may be or include a doped-polysilicon layer. In some embodiments, the work function layer 220A may be formed by a suitable deposition process, such as a chemical vapor deposition (CVD) process.

Figure 3D:
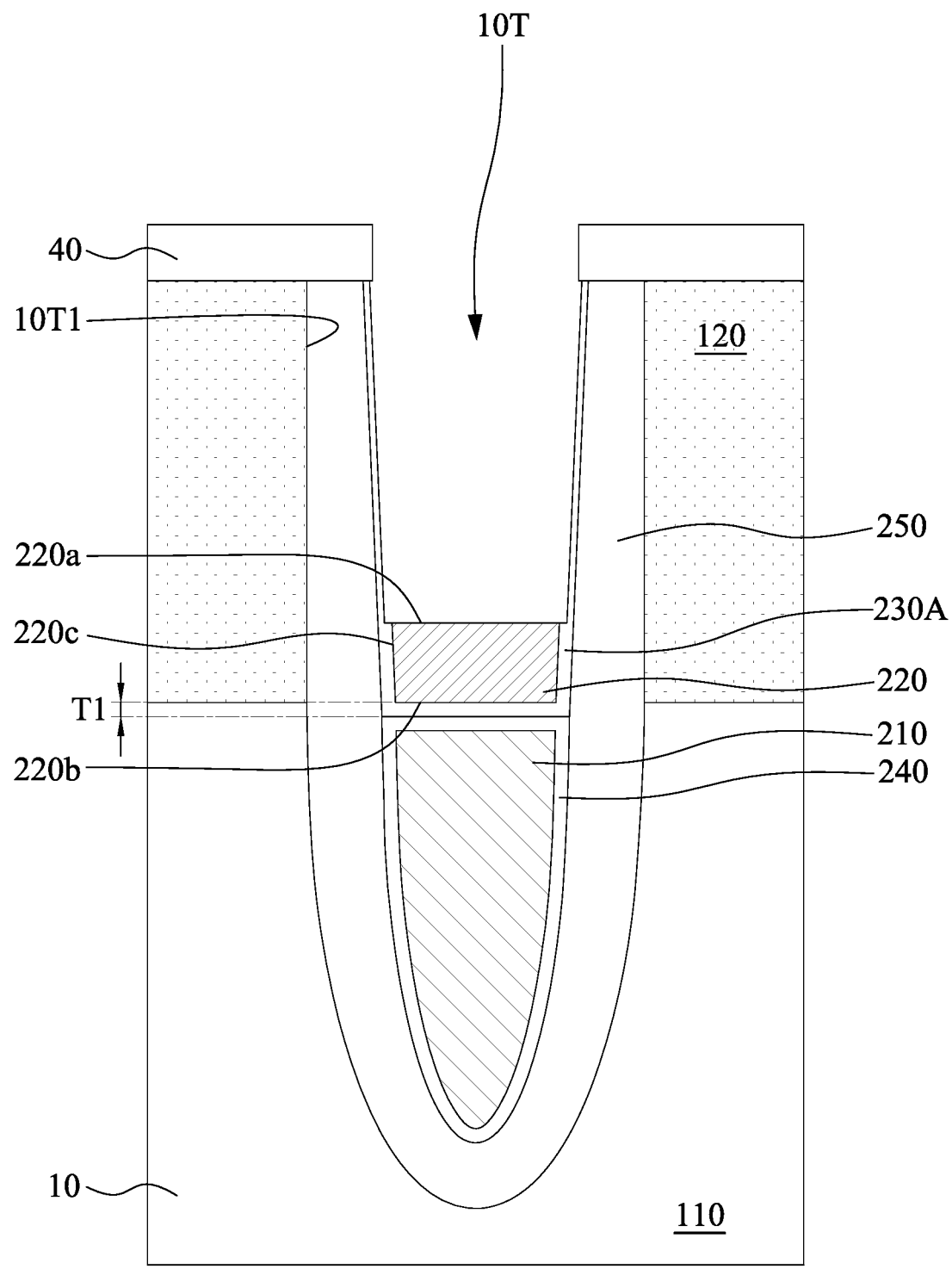
FIG. 3D illustrates one stage of a method of manufacturing a semiconductor device, in accordance with some embodiments of the present disclosure.

Referring to FIG. 3D, the work function layer 220A may be recessed to form a work function layer 220 that is below the top surface 101 of the semiconductor substrate 10. In some embodiments, the work function layer 220A may be recessed by an etching operation. In some embodiments, a plasma etching operation may be performed to remove a portion of the work function layer 220A so as to form the recessed work function layer 220. In some embodiments, the buffer layer 230A may be partially removed when recessing the work function layer 220A. In some embodiments, a portion of the buffer layer 230A exposed to the plasma etching operation may be partially removed.

Figure 3E:
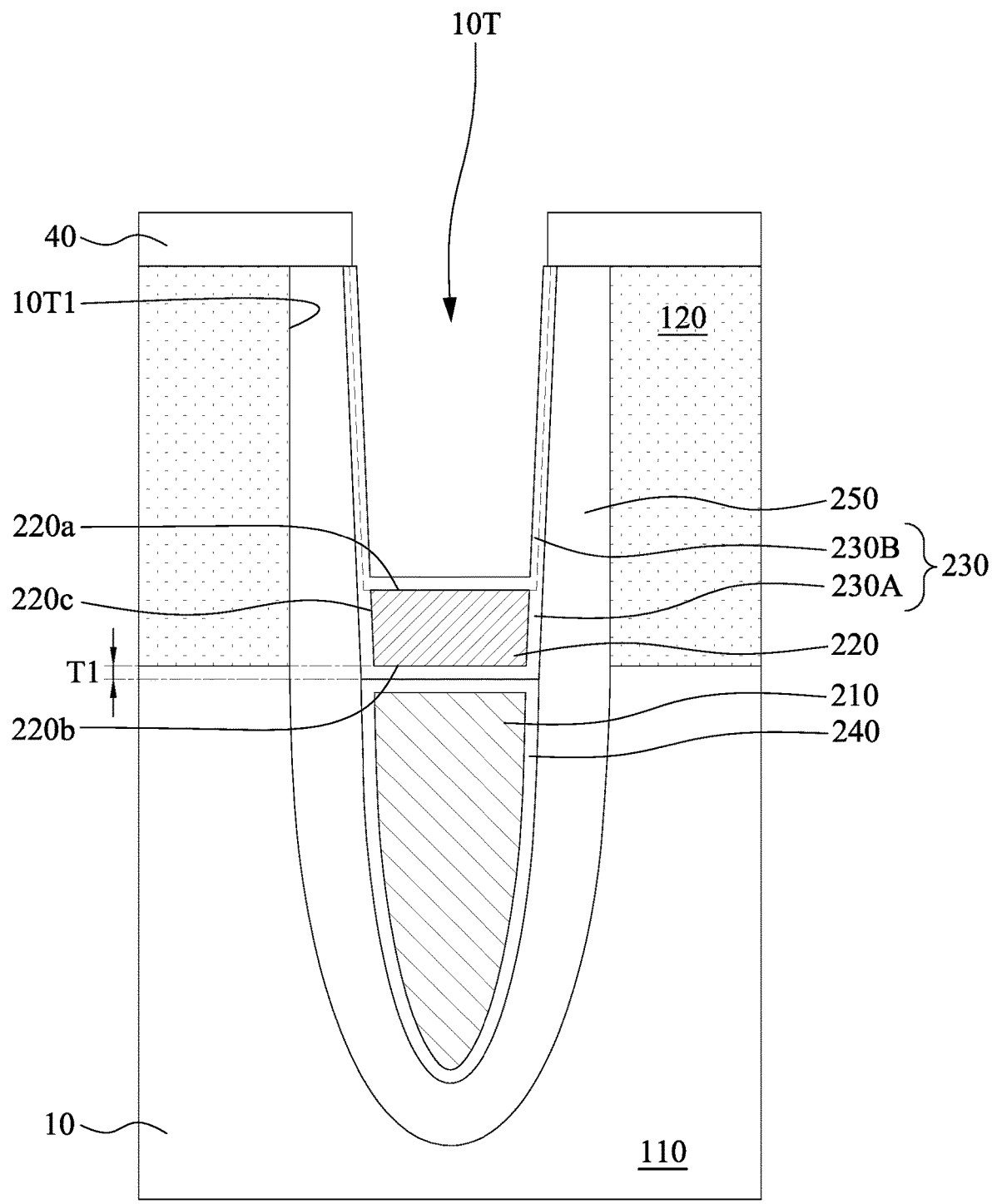
FIG. 3E illustrates one stage of a method of manufacturing a semiconductor device, in accordance with some embodiments of the present disclosure.

Referring to FIG. 3E, a buffer layer 230B may be formed on the work function layer 220 in the trench 10T of the semiconductor substrate 10. In some embodiments, the buffer layer 230B is formed in the trench 10T of the semiconductor substrate 10. In some embodiments, the buffer layer 230B directly contacts the buffer layer 230A. In some embodiments, the buffer layer 230B is formed on a portion of the buffer layer 230A on the inner sidewall 10T1 of the trench 10T of the semiconductor substrate 10. In some embodiments, the buffer layer 230B includes an oxide material. In some embodiments, the buffer layer 230B may be or include silicon oxide. In some embodiments, the buffer layer 230B may have a thickness from about 1 nm to about 2 nm, from about 1.2 nm to about 1.8 nm, from about 1.3 nm to about 1.7 nm, or from about 1.5 nm to about 1.6 nm. In some embodiments, the buffer layer 230B is formed by an atomic layer deposition (ALD) process.

According to some embodiments of the present disclosure, the buffer layer 230B that is further formed on the dielectric layer 250 on the inner sidewall 10T1 of the trench 10T can compensate the loss in the thickness of the dielectric layer 250 during the etching operation for recessing the work function layer 220A. Therefore, the dielectric layer 250 can be provided with sufficient thickness serving as a gate oxide.

In some embodiments, the buffer layer 230A and the work function layer 220A may be formed in-situ. In some embodiments, the buffer layer 230A, the work function layer 220A, and the buffer layer 230B may be formed in-situ. In some embodiments, the buffer layer 230A and the buffer layer 230B may be formed of or include the same material. In some embodiments, the interface between the buffer layer 230A and the buffer layer 230B is not observed. In some embodiments, the buffer layer 230A and the buffer layer 230B collectively form a buffer structure 230.

Figure 3F:
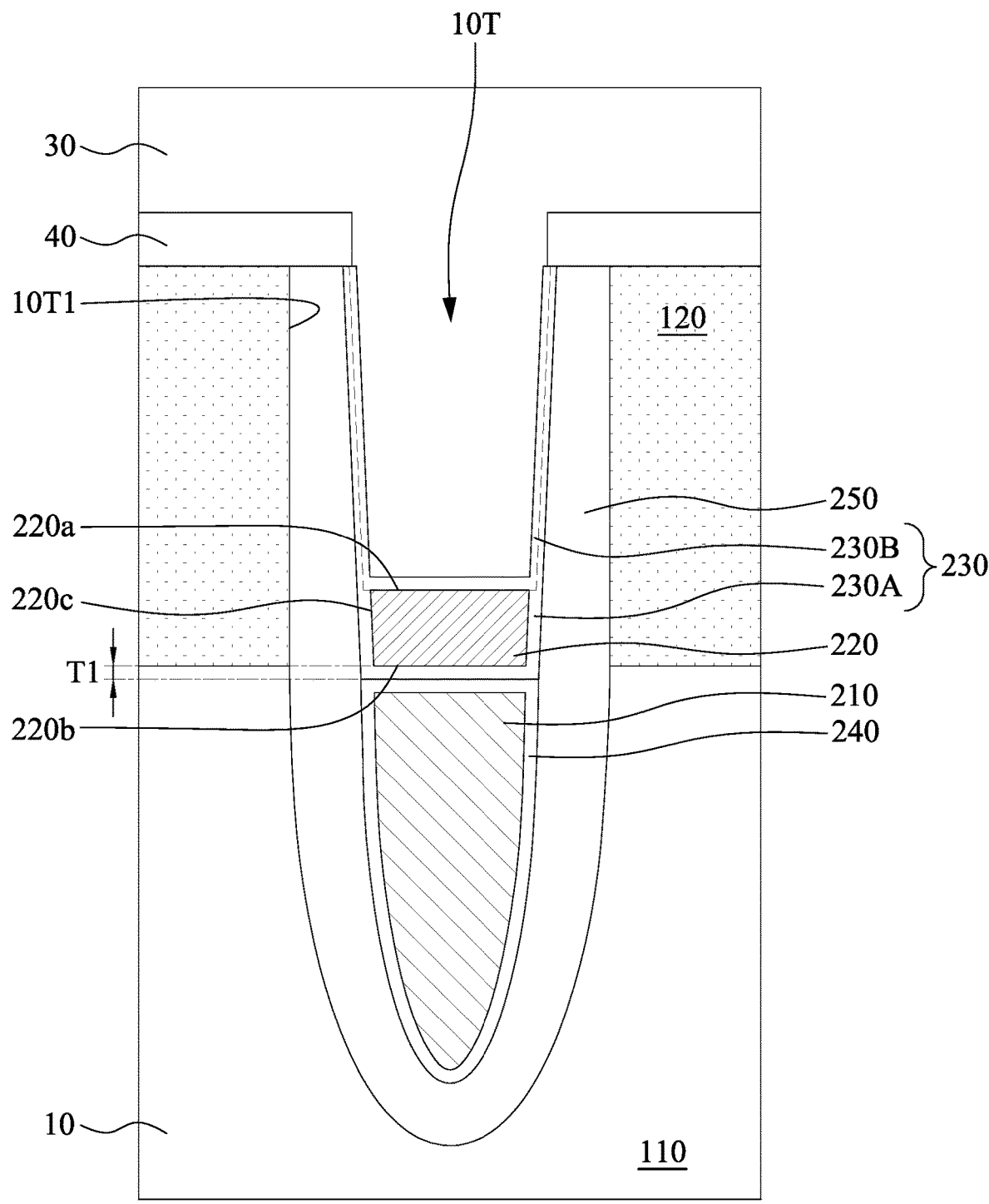
FIG. 3F illustrates one stage of a method of manufacturing a semiconductor device, in accordance with some embodiments of the present disclosure.

Referring to FIG. 3F, a dielectric structure 30 may be formed on the buffer layer 230B (or the buffer structure 230). In some embodiments, the dielectric structure 30 directly contacts the buffer layer 230B (or the buffer structure 230). In some embodiments, the dielectric structure 30 may be or include a nitride layer, e.g., silicon nitride. In some embodiments, the dielectric structure 30 may be formed by a suitable deposition process, such as a chemical vapor deposition (CVD) process.

Figure 3G:
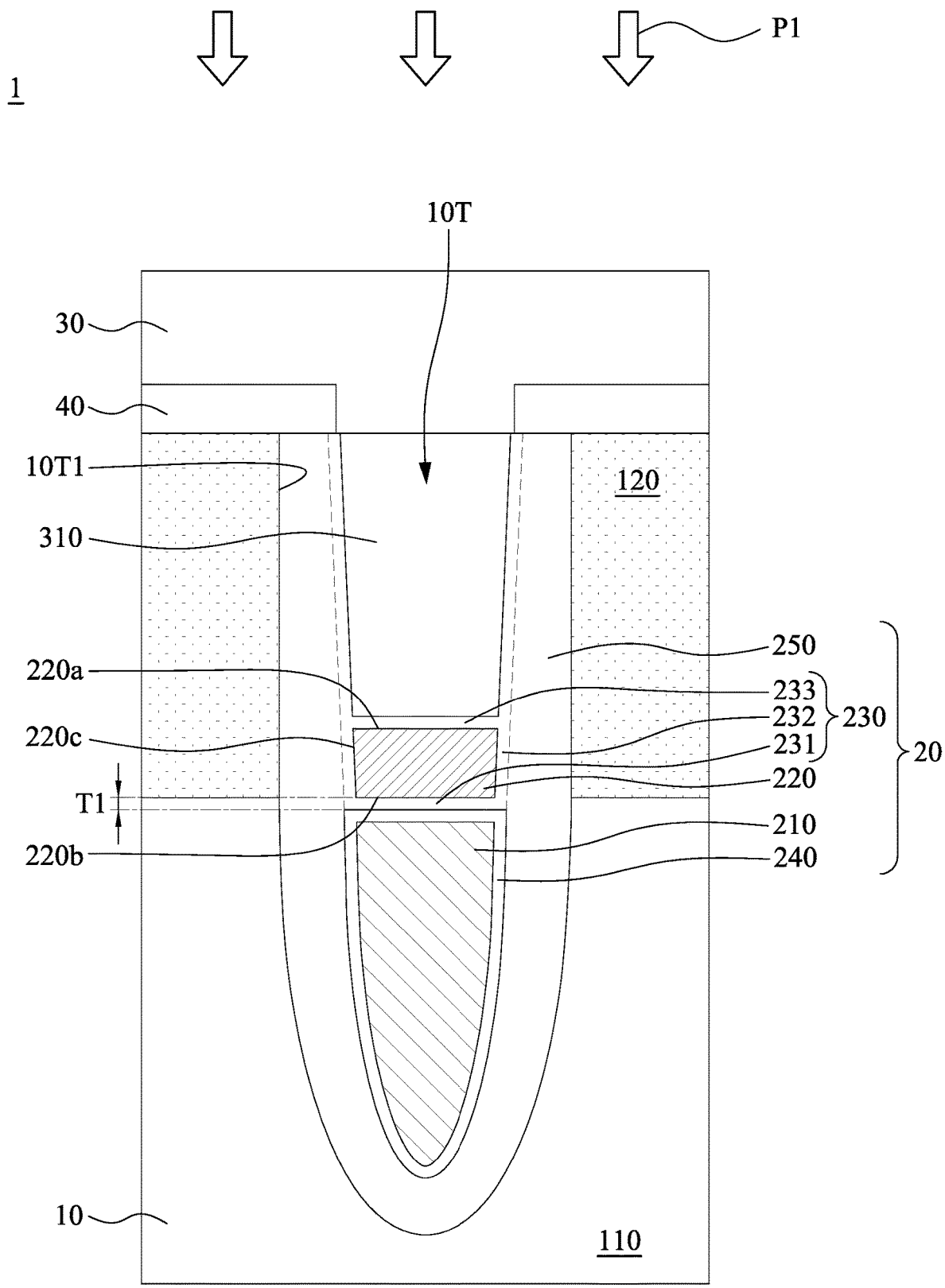
FIG. 3G illustrates one stage of a method of manufacturing a semiconductor device, in accordance with some embodiments of the present disclosure.

Referring to FIG. 3G, a thermal treatment P1 may be performed on the work function layer 220. In some embodiments, the thermal treatment P1 serves to activate the doped regions 120. In some embodiments, the thermal treatment P1 is performed under a temperature of greater than about 900° C., or greater than about 1000° C. In some embodiments, the thermal treatment P1 is performed under a temperature of about 1000° C. In some embodiments, the thermal treatment P1 is performed for about 40 seconds to about 60 seconds. In some embodiments, the thermal treatment P1 is performed for about 50 seconds. In some embodiments, the buffer layer 230A and the dielectric layer 250 directly contact the work function layer 220 (e.g., the doped-polysilicon layer) when performing the thermal treatment P1. In some embodiments, the buffer layers 230A and 230B and the dielectric layer 250 directly contact the work function layer 220 (e.g., the doped-polysilicon layer) when performing the thermal treatment P1. As such, a semiconductor device 1 including the buffer structure 230 between the work function layer 210 and the work function layer 220 is formed.

FIG. 4A, FIG. 4B, FIG. 4C, FIG. 4D, FIG. 4E, and FIG. 4F, illustrate various stages of a method of manufacturing a semiconductor device 2, in accordance with some embodiments of the present disclosure.

Figure 4A:
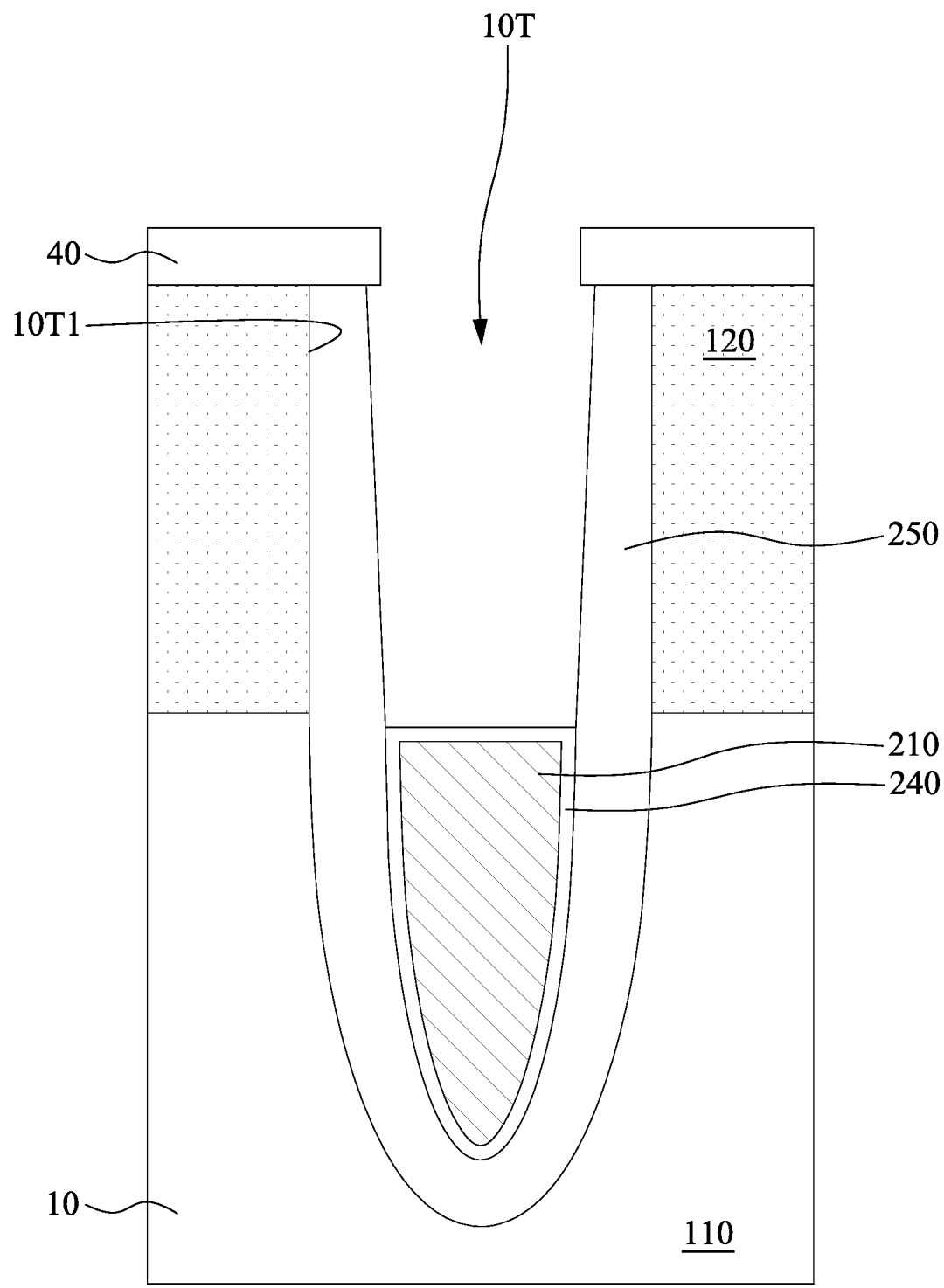
FIG. 4A illustrates one stage of a method of manufacturing a semiconductor device, in accordance with some embodiments of the present disclosure.

Referring to FIG. 4A, a semiconductor substrate 10 having a trench 10T may be provided, a dielectric layer 250 may be formed in the trench 10T, a work function layer 210 may be formed on the dielectric layer 250, and a barrier layer 240 may be formed on the work function layer 210.

In some embodiments, the semiconductor substrate 10 may be formed of, for example, silicon, doped silicon, silicon germanium, silicon on insulator, silicon on sapphire, silicon germanium on insulator, silicon carbide, germanium, gallium arsenide, gallium phosphide, gallium arsenide phosphide, indium phosphide, indium gallium phosphide, or any other IV-IV, III-V or I-VI semiconductor material. One or more isolation structures may be formed in the semiconductor substrate 10, and one or more active regions 110 of the semiconductor substrate 10 may be defined by the isolation structures.

Still referring to FIG. 4A, in some embodiments, one or more doped regions 120 may be formed in the active regions 110. The doped regions 120 may be formed by an implantation process using dopant such as phosphorus, arsenic, or antimony. The doped regions 120 may respectively have a dopant concentration ranging from about $10^{17}$ atoms/cm$^3$ to about $10^{19}$ atoms/cm$^3$. The doped regions 120 may serve as source/drain regions.

Still referring to FIG. 4A, in some embodiments, the trench 10T may be formed in the active region 110 of the semiconductor substrate 10. In some embodiments, the trench 10T may be formed by performing an etching process on the semiconductor substrate 10. In some embodiments, an overlying layer 40 may be disposed over the semiconductor substrate 10 and serve as a patterned hardmask for forming the trench 10T. The etching process may include a selective wet etching process or a selective dry etching process. A wet etching solution may include a TMAH solution, a HF/HNO$_3$/CH$_3$COOH solution, or other suitable solution. The dry and wet etching processes have etching parameters that can be tuned, such as etchants used, etching temperature, etching solution concentration, etching pressure, source power, RF bias voltage, RF bias power, etchant flow rate, and other suitable parameters. In some other embodiments, a wet etching solution may include NH$_4$OH, KOH, HF, TMAH, other suitable wet etching solutions, or combinations thereof. In yet some other embodiments, a dry etching process may include a biased plasma etching process that uses a chlorine-based chemistry. Other dry etchant gasses include CF$_4$, NF$_3$, SF$_6$, and He. Dry etching may also be performed anisotropically using such mechanisms as DRIE.

Still referring to FIG. 4A, in some embodiments, the dielectric layer 250 may be grown on the inner sidewall 10T1 of the trench 10T of the semiconductor substrate 10 using a thermal oxidation process. In some other embodiments, the dielectric layer 250 may be formed by CVD, ALD, or any suitable method.

Still referring to FIG. 4A, in some embodiments, a bottom barrier material may be formed on the dielectric layer 250 in the trench 10T, the work function layer 210 may be formed on the bottom barrier material, and a top barrier material may be formed on the top surface of the work function layer 210. In some embodiments, the bottom barrier material and the top barrier material collectively form the barrier layer 240. In some embodiments, the bottom barrier material, the top barrier material, and the work function layer 210 may be formed by CVD, ALD, or any suitable method.

Figure 4B:
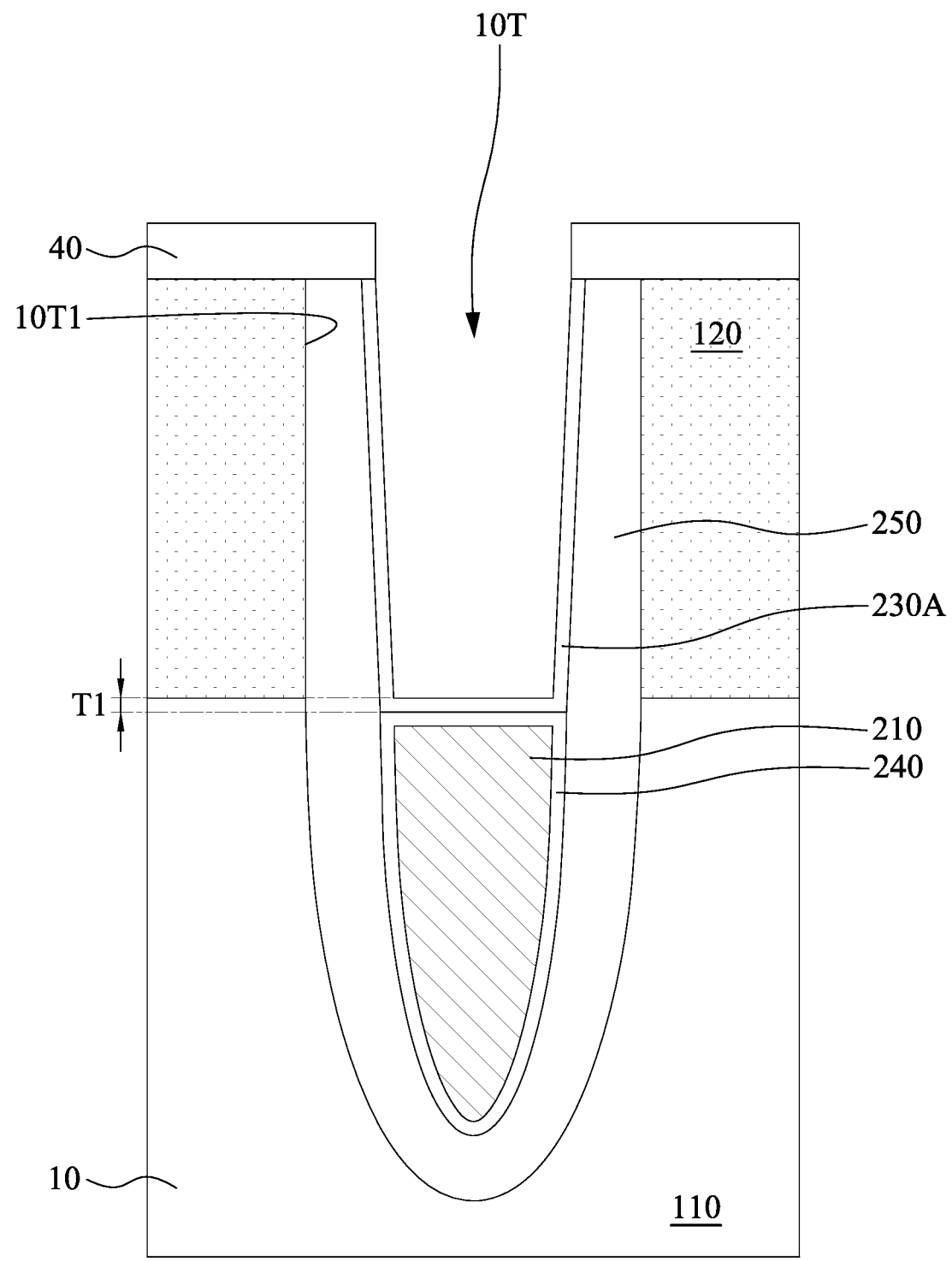
FIG. 4B illustrates one stage of a method of manufacturing a semiconductor device, in accordance with some embodiments of the present disclosure.

Referring to FIG. 4B, a buffer structure 230 may be formed in the trench 10T of the semiconductor substrate 10. In some embodiments, the buffer structure 230 is formed on the barrier layer 240 in the trench 10T of the semiconductor substrate 10. In some embodiments, the buffer structure 230 directly contacts the barrier layer 240. In some embodiments, the buffer structure 230 is formed on the inner sidewall 10T1 of the trench 10T of the semiconductor substrate 10. In some embodiments, the buffer structure 230 is formed on the dielectric layer 250 in the trench 10T of the semiconductor substrate 10. In some embodiments, the buffer structure 230 includes an oxide material. In some embodiments, the buffer structure 230 may be or include silicon oxide. In some embodiments, the buffer structure 230 and the dielectric layer 250 may be formed of or include the same material. In some embodiments, the buffer structure 230 may have a thickness T1 from about 1 nm to about 2 nm, from about 1.2 nm to about 1.8 nm, from about 1.3 nm to about 1.7 nm, or from about 1.5 nm to about 1.6 nm. In some embodiments, the buffer structure 230 is formed by an ALD process.

Figure 4C:
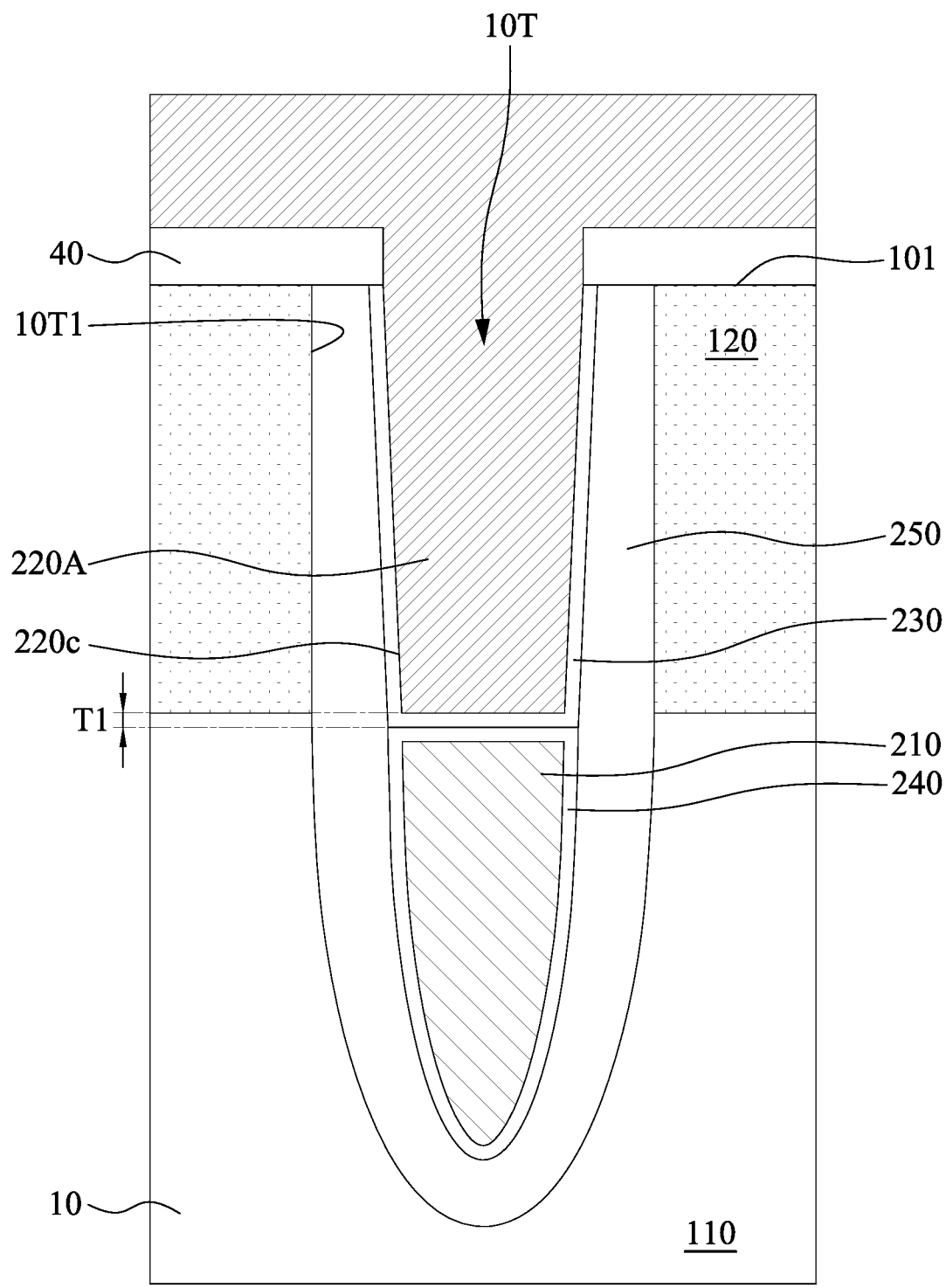
FIG. 4C illustrates one stage of a method of manufacturing a semiconductor device, in accordance with some embodiments of the present disclosure.

Referring to FIG. 4C, a work function layer 220A may be formed on the buffer structure 230 in the trench 10T of the semiconductor substrate 10. In some embodiments, the work function layer 220A directly contacts the buffer structure 230. In some embodiments, the work function layer 220A is further formed over the top surface 101 of the semiconductor substrate 10. In some embodiments, the work function layer 220A includes polysilicon, e.g., doped polysilicon. The dopant may be or include phosphorus, arsenic, or antimony. For example, the work function layer 220A may be a phosphorous-doped polysilicon layer. In some embodiments, the work function layer 220A may be or include a doped-polysilicon layer. In some embodiments, the work function layer 220A may be formed by a suitable deposition process, such as a CVD process.

Figure 4D:
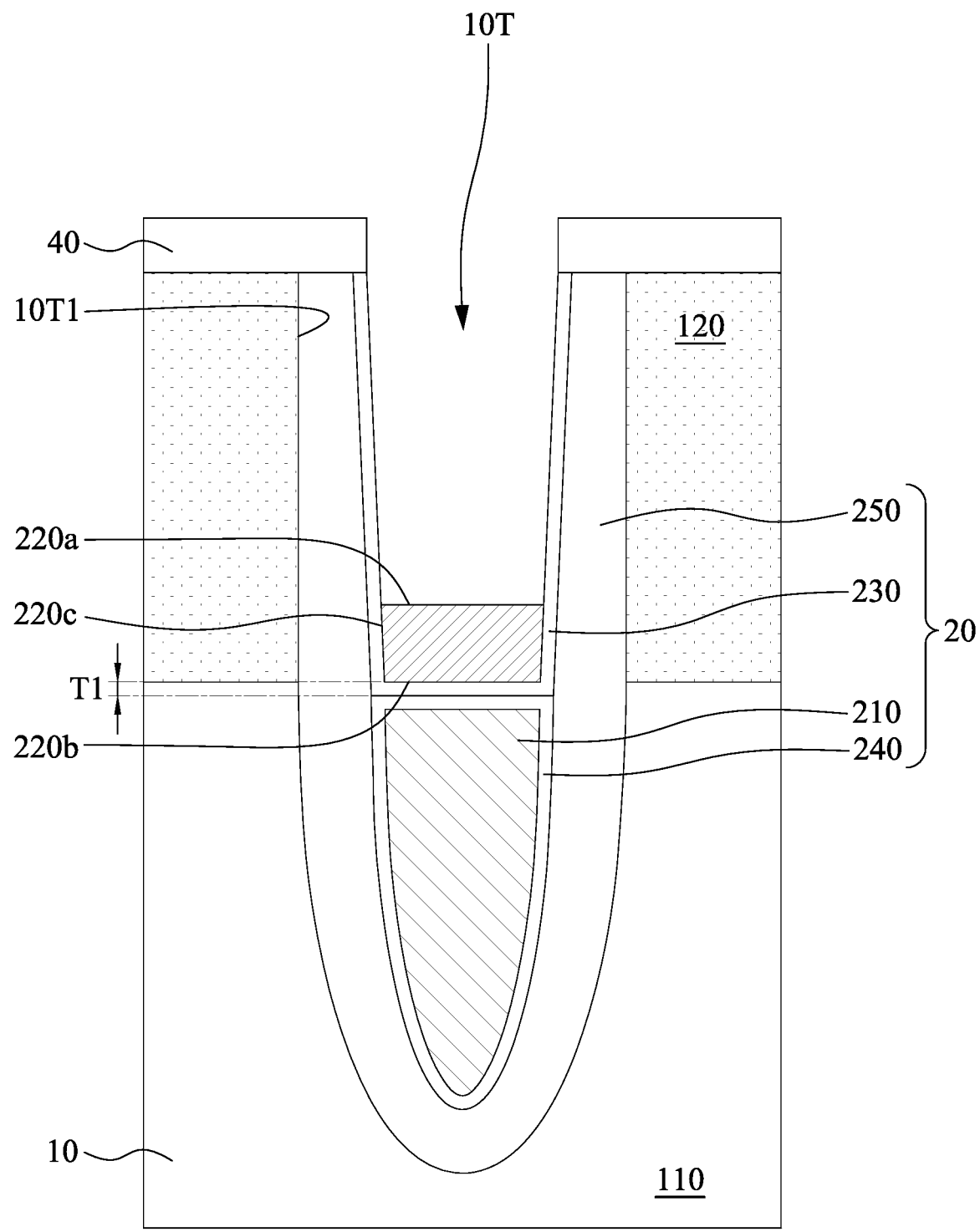
FIG. 4D illustrates one stage of a method of manufacturing a semiconductor device, in accordance with some embodiments of the present disclosure.

Referring to FIG. 4D, the work function layer 220A may be recessed to form a work function layer 220 that is below the top surface 101 of the semiconductor substrate 10. In some embodiments, the work function layer 220A may be recessed by an etching operation. In some embodiments, a plasma etching operation may be performed to remove a portion of the work function layer 220A so as to form the recessed work function layer 220.

Figure 4E:
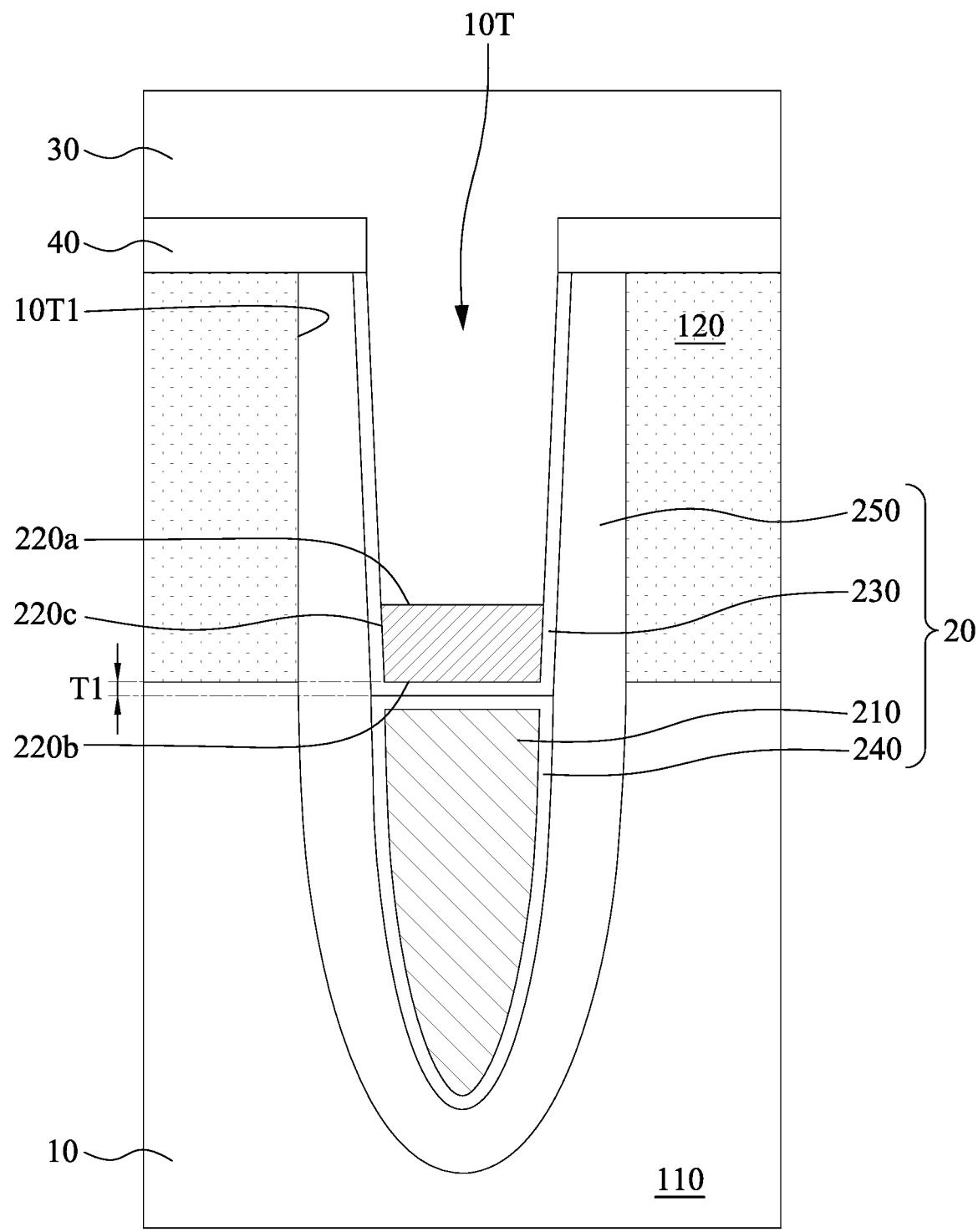
FIG. 4E illustrates one stage of a method of manufacturing a semiconductor device, in accordance with some embodiments of the present disclosure.

Referring to FIG. 4E, a dielectric structure 30 may be formed on the work function layer 220. In some embodiments, the dielectric structure 30 directly contacts the work function layer 220. In some embodiments, the dielectric structure 30 may be or include a nitride layer, e.g., silicon nitride. In some embodiments, the dielectric structure 30 may be formed by a suitable deposition process, such as a CVD process.

Figure 4F:
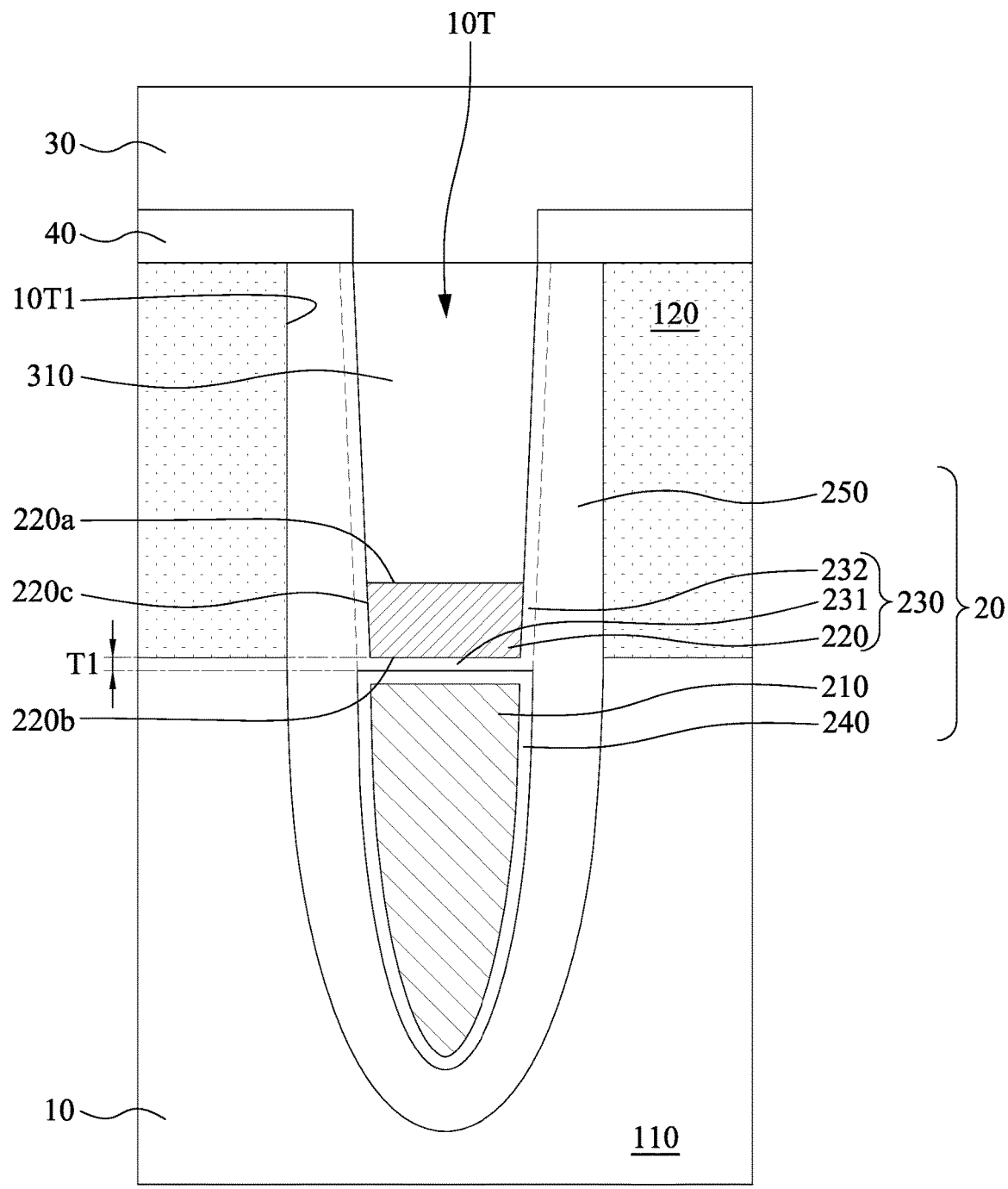
FIG. 4F illustrates one stage of a method of manufacturing a semiconductor device, in accordance with some embodiments of the present disclosure.

Referring to FIG. 4F, a thermal treatment P1 may be performed on the work function layer 220. In some embodiments, the thermal treatment P1 serves to activate the doped regions 120. In some embodiments, the thermal treatment P1 is performed under a temperature of greater than about 900° C., or greater than about 1000° C. In some embodiments, the thermal treatment P1 is performed under a temperature of about 1000° C. In some embodiments, the thermal treatment P1 is performed for about 40 seconds to about 60 seconds. In some embodiments, the thermal treatment P1 is performed for about 50 seconds. In some embodiments, the buffer structure 230 and the dielectric layer 250 directly contact the work function layer 220 (e.g., the doped-polysilicon layer) when performing the thermal treatment P1. As such, a semiconductor device 1 including the buffer structure 230 between the work function layer 210 and the work function layer 220 is formed.

Figure 5:
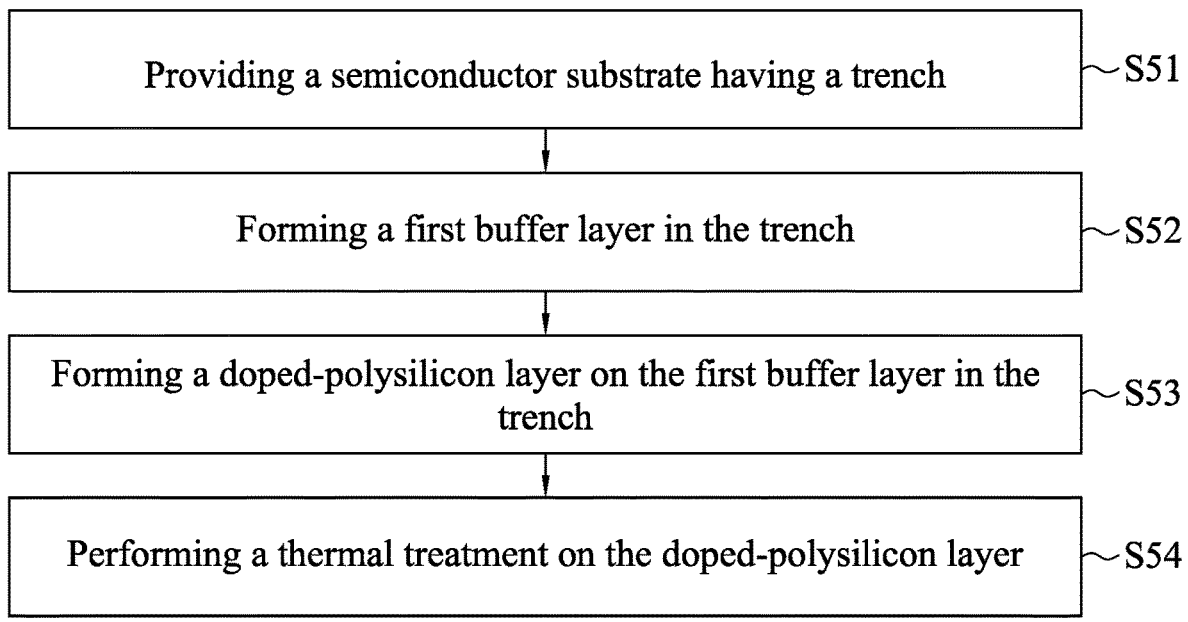
FIG. 5 is a flowchart illustrating a method of manufacturing a semiconductor device, in accordance with some embodiments of the present disclosure.

FIG. 5 is a flowchart illustrating a method 500 of manufacturing a semiconductor device, in accordance with some embodiments of the present disclosure.

The method 500 begins with operation S51 in which a semiconductor substrate is provided. In some embodiments, the semiconductor substrate has a trench.

The method 500 continues with operation S52 in which a first buffer layer is formed in the trench.

The method 500 continues with operation S53 in which a doped-polysilicon layer is formed on the first buffer layer in the trench.

The method 500 continues with operation S54 in which a thermal treatment is performed on the doped-polysilicon layer.

The method 500 is merely an example, and is not intended to limit the present disclosure beyond what is explicitly recited in the claims. Additional operations can be provided before, during, or after each operations of the method 500, and some operations described can be replaced, eliminated, or moved around for additional embodiments of the method. In some embodiments, the method 500 can include further operations not depicted in FIG. 5. In some embodiments, the method 500 can include one or more operations depicted in FIG. 5.

Figure 6:
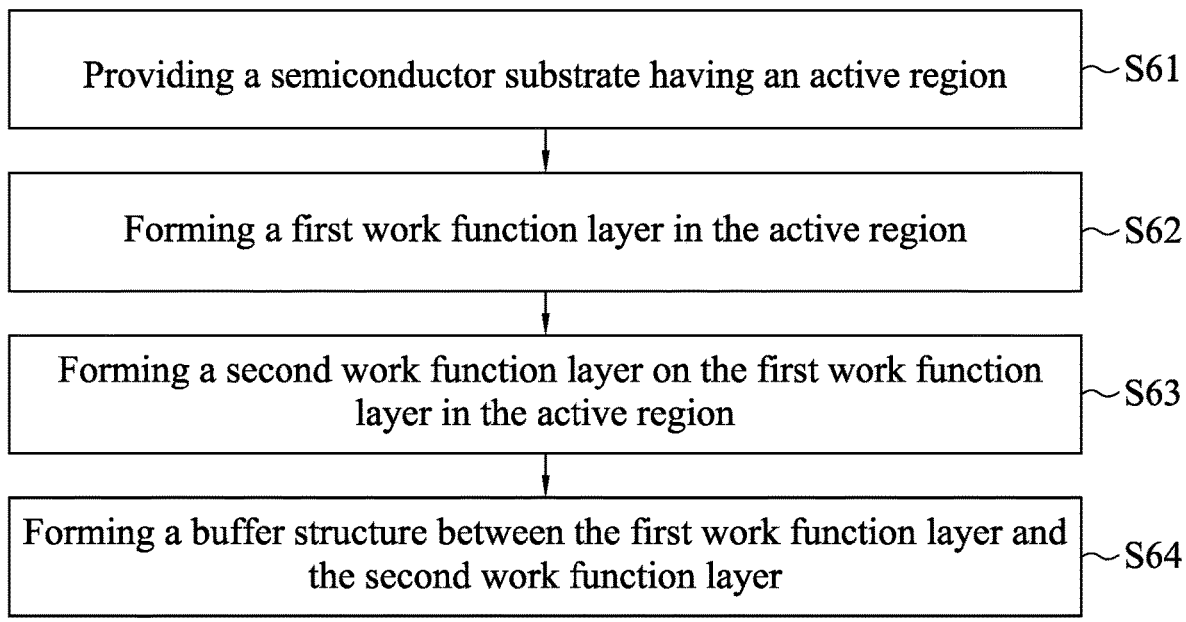
FIG. 6 is a flowchart illustrating a method of manufacturing a semiconductor device, in accordance with some embodiments of the present disclosure.

FIG. 6 is a flowchart illustrating a method 600 of manufacturing a semiconductor device, in accordance with some embodiments of the present disclosure.

The method 600 begins with operation S61 in which a semiconductor substrate is provided. In some embodiments, the semiconductor substrate has an active region.

The method 600 continues with operation S62 in which a first work function layer is formed in the active region.

The method 600 continues with operation S63 in which a second work function layer is formed on the first work function layer in the active region.

The method 600 continues with operation S64 in which a buffer structure is formed between the first work function layer and the second work function layer.

One aspect of the present disclosure provides a semiconductor device. The semiconductor device includes a semiconductor substrate and a word line structure. The semiconductor substrate has an active region. The word line structure is disposed in the active region of the semiconductor substrate. The word line structure includes a first work function layer, a second work function layer, and a buffer structure. The second work function layer is on the first work function layer. The buffer structure is between the first work function layer and the second work function layer.

Another aspect of the present disclosure provides a semiconductor device. The semiconductor device includes a semiconductor substrate and a word line structure. The semiconductor substrate has a trench. The word line structure is disposed in the trench of the semiconductor substrate. The word line structure includes a doped-polysilicon layer and a buffer structure. The buffer structure directly contacts a bottom surface of the doped-polysilicon layer.

Another aspect of the present disclosure provides a method of manufacturing a semiconductor device. The method includes providing a semiconductor substrate having a trench. The method also includes forming a first buffer layer in the trench. The method further includes forming a doped-polysilicon layer on the first buffer layer in the trench. The method also includes performing a thermal treatment on the doped-polysilicon layer.

In the semiconductor device, with the design of the buffer structure, interfaces between the work function layer and its adjacent layers or films are less diverse, and thus the extents of recrystallization of grains in the word function layer at the interfaces between the work function layer and its adjacent layers or films can be relatively uniform, resulting in relatively uniform forces applied on the interfaces during the thermal treatment. Therefore, generation of voids may be mitigated or prevented by a relatively simplified process, and the electrical performance of the semiconductor device can be free from being adversely affected.

Although the present disclosure and its advantages have been described in detail, it should be understood that various changes, substitutions and alterations can be made herein without departing from the spirit and scope of the disclosure as defined by the appended claims. For example, many of the processes discussed can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a semiconductor device, comprising:
    providing a semiconductor substrate having a trench;
    forming a first buffer layer in the trench;
    forming a doped-polysilicon layer on the first buffer layer in the trench;
    performing a thermal treatment on the doped-polysilicon layer;
    forming a second buffer layer on the doped-polysilicon layer prior to performing the thermal treatment; and
    forming a dielectric structure on the second buffer layer prior to performing the thermal treatment.

2. The method of claim 1, wherein the first buffer layer is formed by an atomic layer deposition process.

3. The method of claim 1, wherein the thermal treatment is performed under a temperature of greater than about 900° C.

4. The method of claim 1, further comprising:
    forming a dielectric layer in the trench;
    forming a conductive layer on the dielectric layer; and
    forming a barrier layer on the conductive layer, wherein the first buffer layer is formed on the barrier layer in the trench.

5. The method of claim 4, wherein the first buffer layer directly contacts the barrier layer and the doped-polysilicon layer.

6. The method of claim 4, wherein the first buffer layer and the dielectric layer comprise a same material.

7. The method of claim 4, wherein the first buffer layer and the dielectric layer directly contact the doped-polysilicon layer when performing the thermal treatment.

8. The method of claim 1, further comprising:
    forming a dielectric structure on the doped-polysilicon layer prior to performing the thermal treatment.

* * * * *